US008609527B2

(12) United States Patent
Kurita

(10) Patent No.: US 8,609,527 B2
(45) Date of Patent: Dec. 17, 2013

(54) METHOD OF MANUFACTURING SEMICONDUCTOR DEVICE

(75) Inventor: Isao Kurita, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 36 days.

(21) Appl. No.: 12/923,085

(22) Filed: Aug. 31, 2010

(65) Prior Publication Data

US 2011/0070729 A1 Mar. 24, 2011

(30) Foreign Application Priority Data

Sep. 1, 2009 (JP) ................................. 2009-201810

(51) Int. Cl.
H01L 23/488 (2006.01)
H01L 21/60 (2006.01)

(52) U.S. Cl.
USPC ........................................................ 438/617

(58) Field of Classification Search
USPC ......... 438/106–110, 123, 617, 611, 612, 613, 438/615, FOR. 369; 257/E21.506, E21.508, 257/784, E23.141, E21.509, E23.002, 257/E23.024, E23.025, E23.14
See application file for complete search history.

(56) References Cited

U.S. PATENT DOCUMENTS

| | | | |
|---|---|---|---|
| 6,169,331 B1 * | 1/2001 | Manning et al. | 257/784 |
| 6,835,643 B2 * | 12/2004 | Akram | 438/612 |
| 6,921,016 B2 * | 7/2005 | Takahashi | 228/180.5 |
| 7,021,520 B2 * | 4/2006 | Bowen | 228/180.5 |
| 7,326,594 B2 * | 2/2008 | Beauchamp et al. | 438/123 |
| 7,459,765 B2 * | 12/2008 | Terui et al. | 257/532 |
| 8,132,709 B2 * | 3/2012 | Hayashi et al. | 228/180.5 |
| 2004/0217488 A1 * | 11/2004 | Luechinger | 257/784 |
| 2005/0133928 A1 * | 6/2005 | Howard et al. | 257/773 |
| 2005/0242159 A1 * | 11/2005 | Yajima | 228/180.5 |

FOREIGN PATENT DOCUMENTS

| | | | |
|---|---|---|---|
| JP | 05-13491 | * | 1/1993 |
| JP | 05-243317 | * | 9/1993 |
| JP | 2002-299494 A | | 10/2002 |
| JP | 2003-249521 A | | 9/2003 |
| JP | 2007-535820 A | | 12/2007 |
| JP | 2008-034567 A | | 2/2008 |
| JP | 2008-117888 A | | 5/2008 |
| JP | 2009-259943 A | | 11/2009 |

* cited by examiner

Primary Examiner — Olik Chaudhuri
Assistant Examiner — Quovaunda V Jefferson
(74) Attorney, Agent, or Firm — Rabin & Berdo, P.C.

(57) ABSTRACT

A method of manufacturing a semiconductor device, includes: preparing a semiconductor IC chip and an external electrode terminal which is positioned away from the semiconductor IC chip, wherein the semiconductor IC chip has first and second electrode pads thereon, the second electrode pad being positioned between the first electrode pad and the external electrode terminal; connecting the first electrode pad and the external electrode terminal by a loop-like wire; and pressing a portion of the loop-like wire toward the semiconductor IC chip, thereby connecting the portion of the loop-like wire with the second electrode pad.

14 Claims, 5 Drawing Sheets

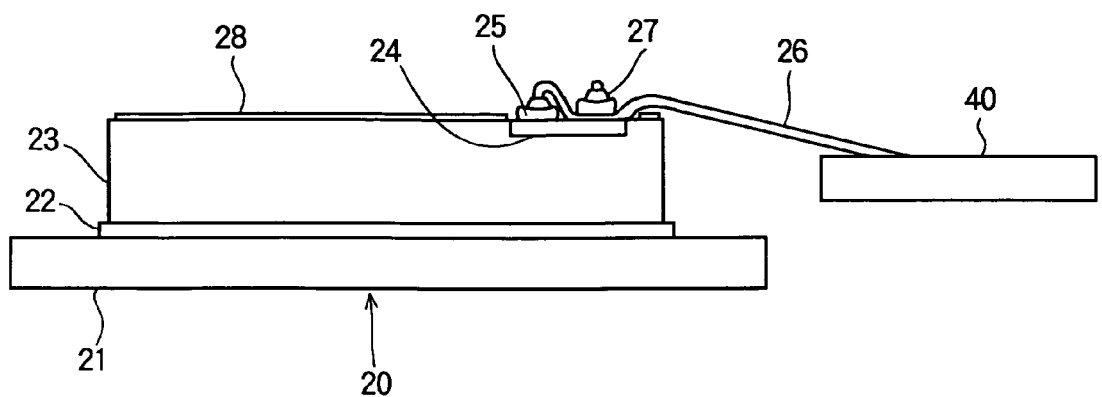
FIG.8
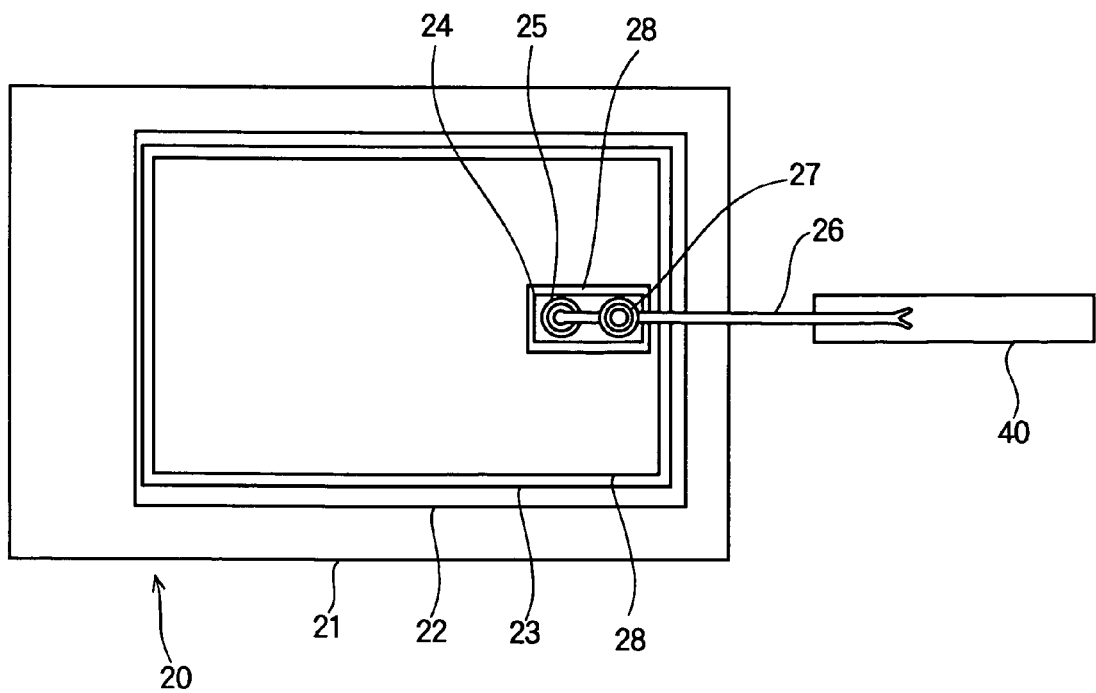

METHOD OF MANUFACTURING SEMICONDUCTOR DEVICE

BACKGROUND OF THE INVENTION

1. Field of the Invention

The present invention relates to a semiconductor device which has a structure that a semiconductor IC chip and an external electrode terminal are connected through a loop-like wire formed by wire bonding, a method of manufacturing the semiconductor device, and a wire bonding method.

2. Description of the Related Art

Various methods have been suggested to produce an electrical connection between an electrode pad of a semiconductor IC chip and an inner lead by wire bonding, at manufacturing a semiconductor device, in Japanese Patent Kokai Publication No. 2008-117888 (Patent Document 1) and Japanese Patent Kokai Publication No. 2008-34567 (Patent Document 2), for example. FIG. 13 illustrates a typical wire bonding method which has the steps of: bonding a gold ball 5 to an electrode pad 4 of a semiconductor IC chip 3, which is fixed on a die pad 1 with an adhesive agent 2, by using a wire bonding apparatus (not illustrated in the drawing), forming a loop-like wire 6 so that a neck (a part standing straight) 6a of a predetermined length $H_{6a}$ is formed in a direction of right above a top 5a of the gold ball 5, and extending the wire to the inner lead 40 and bonding the extended loop-like wire 6 to an inner lead 40.

However, in the wire bonding of the conventional manufacturing method, it is necessary that the length $H_{6a}$ of the neck 6a of the loop-like wire 6 is considerably long in order to reduce stress occurring at the top 5a of the gold ball 5. For this reason, the conventional semiconductor device which includes the semiconductor IC chip 3 and the loop-like wire 6 has the following problem that: it is difficult to reduce a height $H_6$ of the loop-like wire 6 sufficiently, and thus the semiconductor device cannot be sufficiently reduced in thickness.

SUMMARY OF THE INVENTION

An object of the present invention is to provide a method of manufacturing the semiconductor device which may realize a semiconductor device which is reduced in thickness.

According to an aspect of the present invention, a method of manufacturing a semiconductor device, includes: preparing a semiconductor IC chip and an external electrode terminal which is positioned away from the semiconductor IC chip, wherein the semiconductor IC chip has first and second electrode pads thereon, the second electrode pad being positioned between the first electrode pad and the external electrode terminal; connecting the first electrode pad and the external electrode terminal by a loop-like wire; and pressing a portion of the loop-like wire toward the semiconductor IC chip, thereby connecting the portion of the loop-like wire with the second electrode pad.

According to another aspect of the present invention, a method of manufacturing a semiconductor device, includes: preparing a semiconductor IC chip and an external electrode terminal which is positioned away from the semiconductor IC chip, wherein the semiconductor IC chip has first electrode pad which has first and second portions thereon, the second portion being positioned between the first portion of the first electrode pad and the external electrode terminal; connecting the first portion of the first electrode pad and the external electrode terminal by a loop-like wire; and pressing a portion of the loop-like wire toward the semiconductor IC chip, thereby connecting the portion of the loop-like wire with the second portion of the first electrode pad.

According to a further aspect of the present invention, a method of manufacturing a semiconductor device, includes: bonding an end of a wire to an electrode pad of a semiconductor IC chip by using a gold ball, and bonding the other end of the wire to an external electrode terminal, thereby forming a loop-like wire extending from the electrode pad to the external electrode terminal; and bonding the loop-like wire by using a bump gold ball so that a part of the loop-like wire, which is at a predetermined position on the semiconductor IC chip on a side of the external electrode terminal from the gold ball, is pressed down toward the semiconductor IC chip; wherein the predetermined position is set at a position so that at least a height of a highest part of the loop-like wire on the side of the external electrode terminal from the bump gold ball is lower than a height of a top of the bump gold ball.

According to a still further aspect, a semiconductor device includes:

a semiconductor IC chip having an electrode pad;

an external electrode terminal;

a loop-like wire connecting the electrode pad of the semiconductor IC chip and the external electrode terminal;

a gold ball by which an end of the loop-like wire is bonded to the electrode pad; and a bump gold ball by which the loop-like wire is bonded so that a part of the loop-like wire, which is at a predetermined position on the semiconductor IC chip on a side of the external electrode terminal from the gold ball, is pressed down toward the semiconductor IC chip;

wherein the predetermined position is set at a position so that at least a height of a highest part of the loop-like wire on the side of the external electrode terminal from the bump gold ball is lower than a height of a top of the bump gold ball.

In the above semiconductor device, the predetermined position may be set at a position so that a height of a highest part of the whole of the loop-like wire is lower than a height of the top of the bump gold ball.

In the above semiconductor device, the semiconductor device, the semiconductor IC chip mat have another electrode pad on the side of the external electrode terminal from the gold ball, and the bump gold ball bonds the loop-like wire to said another electrode pad.

In the above semiconductor device, the electrode pad may have a bonding area on the side of the external electrode terminal from the gold ball, and the bump gold ball bonds the loop-like wire to the bonding area of the electrode pad.

In the above semiconductor device, the bump gold ball may have a center on the side of the external electrode terminal from a center of the gold ball, and bonds the loop-like wire onto the gold ball.

The above semiconductor device may further include an insulating film being formed on the semiconductor IC chip on the side of the external electrode terminal from the gold ball.

In the above semiconductor device, a height of a highest part of the loop-like wire before the bonding by using the bump gold ball may be within a range from 80 μm to 150 μm, and a height of a highest part of the loop-like wire after the bonding by using the bump gold ball may be lower than the height of the highest part of the loop-like wire before the bonding by using the bump gold ball.

According to a still further aspect, a semiconductor device includes:

an inner lead;

a semiconductor IC chip being formed at a distance from the inner lead and having a first electrode disposed on a surface of the semiconductor IC chip and a second electrode disposed on a side of the inner lead from the first electrode on the surface of the semiconductor IC chip, the second electrode being electrically connected to the first electrode;

a gold ball being formed on the first electrode so that the gold ball is electrically connected to the first electrode;

a loop-like wire extending from the gold ball to the inner lead through above the second electrode so as to be electrically connected to the inner lead; and a bump gold ball being formed on the second electrode so that the bump gold ball is electrically connected to the second electrode through the loop-like wire.

In the above semiconductor device, it is possible that a height of the loop-like wire from the surface of the semiconductor IC chip does not exceed a height of the bump gold ball from the surface of the semiconductor IC chip.

In the above semiconductor device, the surface of the semiconductor IC chip between the second electrode and the inner lead may be covered by an insulating film.

In the above semiconductor device, the first electrode and the second electrode may be integrally formed as a single unit.

According to a still further aspect, a semiconductor device includes:

an inner lead;

a semiconductor IC chip being formed at a distance from the inner lead and having a first electrode on a surface of the semiconductor IC chip;

a gold ball being formed on the first electrode so that the gold ball is electrically connected to the first electrode;

a loop-like wire extending from the gold ball to the inner lead so as to be electrically connected to the inner lead; and a bump gold ball being formed on the first electrode so that the bump gold ball is electrically connected to the first electrode through the loop-like wire.

In the above semiconductor device, it is possible that a height of the loop-like wire from the surface of the semiconductor. IC chip does not exceed a height of the bump gold ball from the surface of the semiconductor IC chip.

According to the present invention, a conductive bump such as a bump gold ball is bonded at a position where a height of the highest part of a loop-like wire may be reduced, thereby a semiconductor device which is reduced in thickness may be realized.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 7 is a longitudinal sectional view schematically illustrating a semiconductor device according to a second embodiment of the present invention;

FIG. 8 is a plan view schematically illustrating the structure of FIG. 7;

DETAILED DESCRIPTION OF THE INVENTION

First Embodiment

Further scope of applicability of the present invention will become apparent from the detailed description given hereinafter. However, it should be understood that the detailed description and specific examples, while indicating preferred embodiments of the invention, are given by way of illustration only, since various changes and modifications will become apparent to those skilled in the art from the detailed description.

Figure 2:
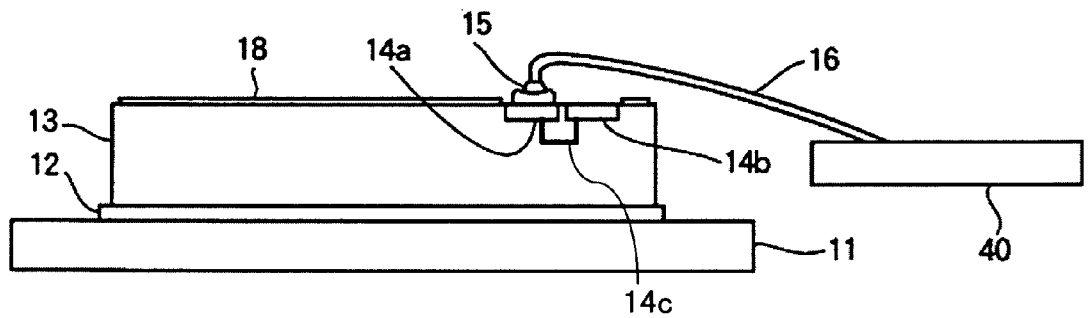
FIG. 2 is a longitudinal sectional view schematically illustrating a second step of the method of manufacturing the semiconductor device according to the first embodiment of the present invention.
Figure 3:
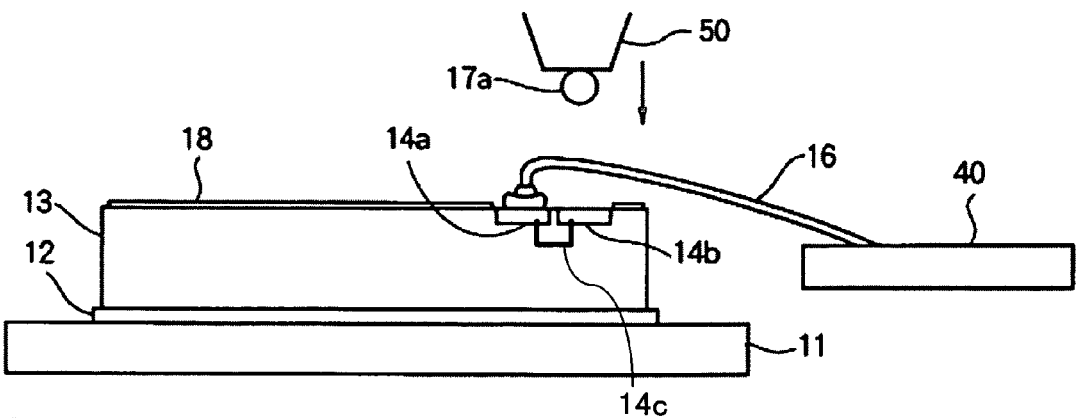
FIG. 3 is a longitudinal sectional view schematically illustrating a third step of the method of manufacturing the semiconductor device according to the first embodiment of the present invention.
Figure 4:
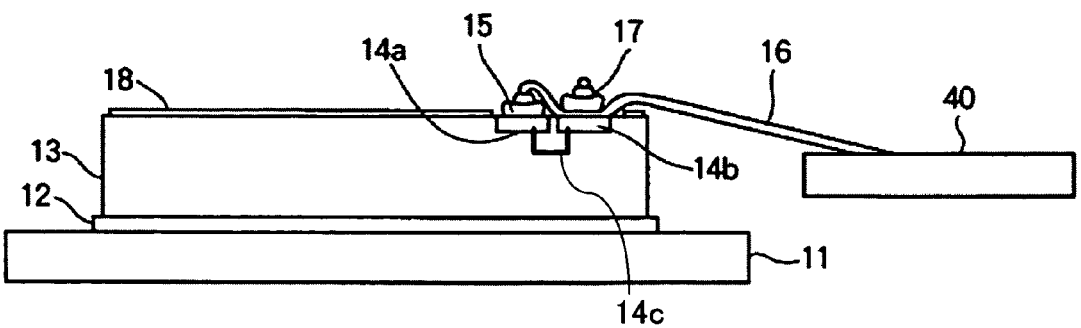
FIG. 4 is a longitudinal sectional view schematically illustrating a fourth step of the method of manufacturing the semiconductor device according to the first embodiment of the present invention.
Figure 5:
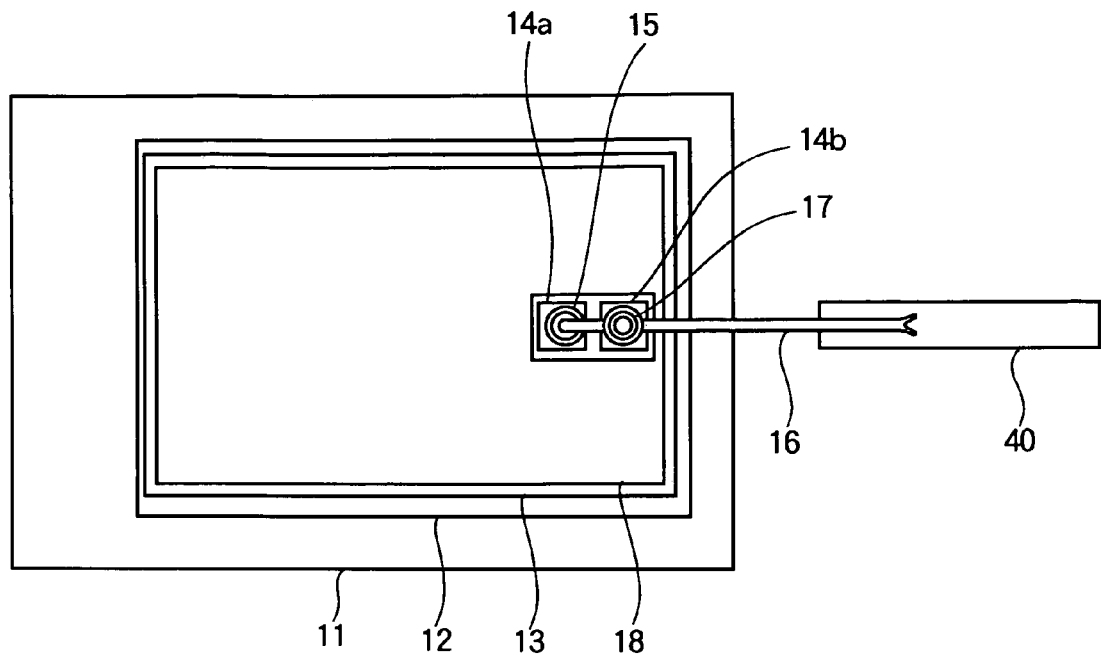
FIG. 5 is a plan view schematically illustrating the structure of FIG. 4.

FIGS. 1 to 4 are longitudinal sectional views schematically illustrating steps of a method of manufacturing a semiconductor device according to a first embodiment of the present invention, and FIG. 5 is a plan view schematically illustrating the structure of FIG. 4.

Figure 1:
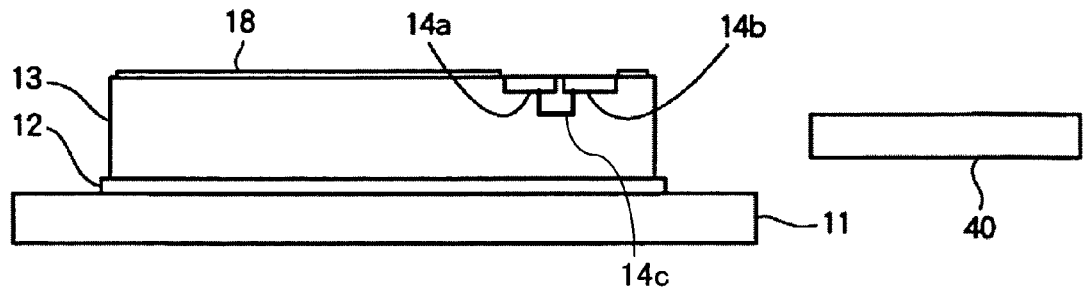
FIG. 1 is a longitudinal sectional view schematically illustrating a first step of a method of manufacturing a semiconductor device according to a first embodiment of the present invention.

Firstly, in the method of manufacturing the semiconductor device according to the first embodiment, as illustrated in FIG. 1, a semiconductor IC chip 13 which is fixed on a die pad 11 with an adhesive agent 12 and an inner lead 40 which is an external electrode terminal are placed at predetermined positions in a wire bonding apparatus (not illustrated in the drawing). At that time, in general, the inner lead 40 is placed to be lower than a surface of the semiconductor IC chip 13. In the first embodiment, the semiconductor IC chip 13 has a first electrode pad 14*a* and a second electrode pad 14*b* for wire bonding which are arranged side by side in a direction toward the inner lead 40 and on the upper surface of the chip. The first electrode pad 14*a* and the second electrode pad 14*b* are two separated electrodes which are electrically connected with each other in the semiconductor IC chip 13 by a conductive member or conductive line 14*c*, for example. In the first embodiment, the first electrode pad 14*a* and the second electrode pad 14*b* are formed so that their upper surfaces are the same in height.

In the first embodiment, the semiconductor IC chip 13 may have an insulating film 18 on its upper surface. It is sufficient that the insulating film 18 covers at least the surface below a loop-like wire 16 which electrically connects a bump gold ball 17 and the inner lead 40. In this case, even if the loop-like wire 16 which will be described below touches the semiconductor IC chip 13 because a height of the loop-like wire 16 is too low, the touch is caused on the insulating film 18 and therefore there is no damage to performance.

Next, as illustrated in FIG. 2, by a capillary of the wire bonding apparatus (not illustrated in the drawing), a gold ball (i.e., a first gold ball) 15 is formed on the first electrode pad 14a, an end of the wire is bonded by using the gold ball 15 to the first electrode pad 14a of the semiconductor IC chip 13, the other end of the wire is bonded to the inner lead 40, and thus the loop-like wire 16 is formed so as to extend from the first electrode pad 14a to the inner lead 40. At this time, the loop-like wire 16 is formed so as to extend from the first electrode pad 14a through above the second electrode pad 14b to the inner lead 40. Therefore, at the following step of bonding the loop-like wire 16 to the second electrode pad 14b by using the bump gold ball 17, the loop-like wire 16 may be pressed down by using the bump gold ball 17 near a starting point of the bonding, i.e., near a point where the loop-like wire 16 is generally the highest, as well as the loop-like wire 16 may be electrically connected to the second electrode pad 14b, which is electrically connected to the first electrode pad 14a. Thus, an advantage of the present invention that electrical reliability is improved between the semiconductor IC chip 13 and the inner lead 40 while the loop-like wire 16 is reduced in height may be more effectively realized. Although the height of the loop-like wire 16 is approximately 80 to 150 μm in this case, it is desirable that the height of the loop-like wire 16 be lower (e.g., approximately 80 to 100 μm).

Next, as illustrated in FIG. 3, a bump gold ball (or a second gold ball) 17a is formed at a tip of the capillary 50 of the wire bonding apparatus. Then, as illustrated in FIG. 4, the bump gold ball 17 is bonded so that the loop-like wire 16 is pressed down toward the semiconductor IC chip 13 at a predetermined position on the semiconductor IC chip 13, on a side of the inner lead 40 from the gold ball 15, i.e., at a position on the second electrode pad 14b. The bump gold ball 17 is electrically connected to the second electrode pad 14b through the loop-like wire 16 which is interposed therebetween, and the second electrode pad 14b is electrically connected to the first electrode pad 14a. Since the loop-like wire is reduced in height, even if the loop-like wire 16 on the gold ball 15 is ruptured, reliability of the electrical connection between the semiconductor IC chip 13 and the inner lead 40 may be improved.

Figure 6:
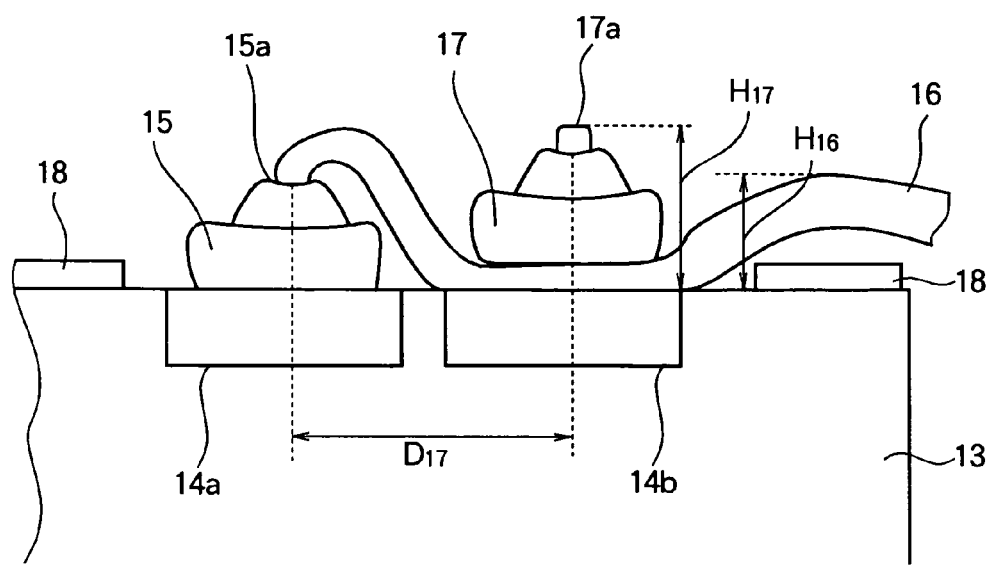
FIG. 6 is an enlarged view of a main part for explaining the semiconductor device and the method of manufacturing the semiconductor device according to the first embodiment of the present invention.

FIG. 6 is an enlarged view of a main part for explaining the semiconductor device and the method of manufacturing the semiconductor device according to the first embodiment of the present invention. As illustrated in FIG. 6, the predetermined position (which may be specified by a distance $D_{17}$ between a center of the gold ball 15 and a center of the bump gold ball 17, for example) is set so that a height of a highest part of the loop-like wire 16 after the step of bonding the loop-like wire 16 by using the bump gold ball 17 is lower than a height of the highest part of the loop-like wire 16 before the step of bonding the loop-like wire 16 by using the bump gold ball 17, and at least a height $H_{16}$ of a highest part of the loop-like wire 16 on a side of the inner lead 40 from the bump gold ball 17 is lower than a height $H_{17}$ of a top 17a of the bump gold ball 17. It is desirable for the predetermined position to be set so that a height of a highest part of the whole of the loop-like wire 16 (a height of a highest part in a range which includes a side of the gold ball 15 from the bump gold ball 17) is lower than that of the top 17a of the bump gold ball 17 (e.g., 50 μm of height or less).

The predetermined position may be calculated or experimentally determined on the basis of conditions such as a position of the gold ball 15, a position of the inner lead 40, material for the loop-like wire 16 and the bump gold ball 17, operational conditions of the capillary to be used, and a tolerance value for stress occurring at the top 15a of the gold ball 15. For example, it is desirable that the position of the bump gold ball 17 be the highest position of the loop-like wire 16 or a neighboring position thereof before bonding the bump gold ball 17. For this reason, in the semiconductor IC chip 13, it is necessary that the second electrode pad 14b is formed at a position which corresponds to the desired predetermined position.

As described above, according to the semiconductor device and the method of manufacturing the semiconductor device of the first embodiment, the height of the highest part of the loop-like wire 16 may be lowered by bonding the bump gold ball 17 which presses down the loop-like wire 16 toward the semiconductor IC chip 13, therefore the semiconductor device may be reduced in thickness.

When the first electrode pad 14a and the second electrode pad 14b are separated electrodes, the first electrode pad 14a and the second electrode pad 14b may be disposed so that they are considerably distant from each other. Thus, the semiconductor device and the method of manufacturing the semiconductor device according to the first embodiment is suitable for a case that the bonding position of the bump gold ball 17 needs be considerably distant from the bonding position of the gold ball 15. For example, if the loop-like wire 16 has a long length (e.g., 3 mm or more), the loop-like wire 16 may be high in a middle of the loop-like wire 16, not near the semiconductor IC chip 13. In this case, it is effective that the first electrode pad 14a and the second electrode pad 14b are disposed at a distance from each other and the second electrode pad 14b is disposed at a position where a lowest height of the loop-like wire 16 may be obtained.

Second Embodiment

Figure 9:
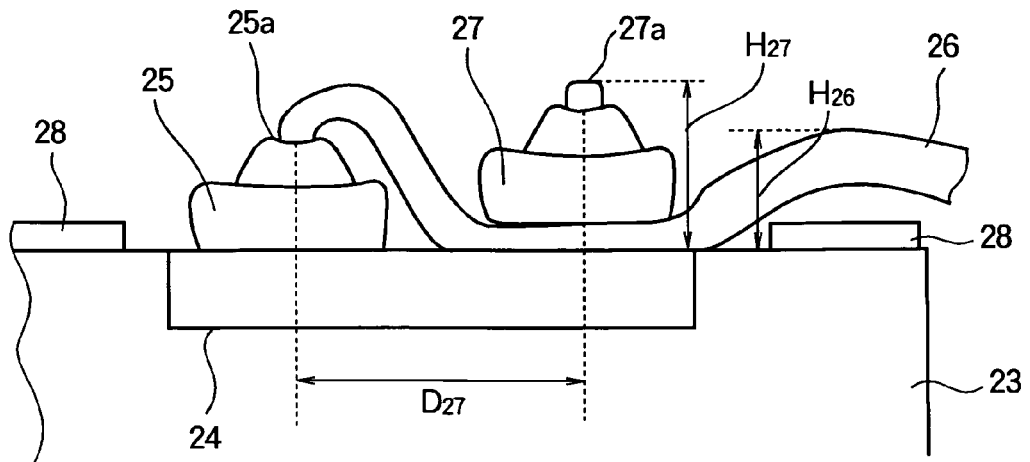
FIG. 9 is an enlarged view of a main part for explaining the semiconductor device and a method of manufacturing the semiconductor device according to the second embodiment.

FIG. 7 is a longitudinal sectional view schematically illustrating steps of a method of manufacturing a semiconductor device according to a second embodiment of the present invention, FIG. 8 is a plan view schematically illustrating the structure of FIG. 7, and FIG. 9 is an enlarged view of a main part for explaining the semiconductor device according to the second embodiment of the present invention and the method of manufacturing the semiconductor device.

In the method of manufacturing the semiconductor device according to the second embodiment, as illustrated in FIG. 7, a semiconductor IC chip 23 which is fixed on a die pad 21 with an adhesive agent 22 and the inner lead 40 are disposed in predetermined positions in a wire bonding apparatus (not illustrated in the drawing). At this time, in general, the inner lead 40 is disposed to be lower than an upper surface of the semiconductor IC chip 23. In the second embodiment, the semiconductor IC chip 23 has a single electrode pad 24 for wire bonding which has a long length in a direction toward the inner lead 40 on the upper surface of the chip. The electrode pad 24 of the second embodiment may include a structure that the first electrode pad 14a and the second electrode pad 14b of the first embodiment are integrally formed as a single unit. An insulating film 28 may be provided on the upper surface of the semiconductor IC chip 23, if necessary. It is sufficient that the insulating film 28 is formed at least below a loop-like wire 26 which electrically connects a bump gold ball 27 and the inner lead 40.

Next, by a capillary (not illustrated in the drawing), a gold ball 25 is formed on the electrode pad 24 of the semiconductor IC chip 23, an end of a wire is bonded to the electrode pad 24 by the gold ball 25, and the other end of the wire is bonded to the inner lead 40, thereby forming the loop-like wire 26 extending from the gold ball 25 on the electrode pad 24 to the inner lead 40. The other end of the wire may be bonded to the inner lead 40, for example, by a known wire bonding method or the like.

Next, a bump gold ball is formed at a tip of the capillary. Then, the loop-like wire 26 is bonded by using the bump gold ball 27 so that the bump gold ball 27 presses down the loop-like wire 26 toward the semiconductor IC chip 23, at a predetermined position on the semiconductor IC chip 23 on a side of the inner lead 40 from the gold ball 25, i.e., in a wire bonding area on the side of the inner lead 40 from the gold ball 25 on the electrode pad 24.

In a similar manner to in the first embodiment, the predetermined position (which may be specified by a distance $D_{27}$ between a center of the gold ball 25 and a center of the bump gold ball 27, for example) is set so that a height of a highest part, of the loop-like wire 26 after the step of bonding the loop-like wire 26 by using the bump gold ball 27 is lower than a height of the highest part of the loop-like wire 26 before the step of bonding the loop-like wire 26 by using the bump gold ball 27 and at least a height $H_{26}$ of a highest part of the loop-like wire 16 on a side of the inner lead 40 from the bump gold ball 27 is lower than a height $H_{27}$ of a top 27a of the bump gold ball 27 (e.g., 50 μm of height or less). It is desirable for the predetermined position to be set so that a height of a highest part of the whole of the loop-like wire 26 is lower than that of the top 27a of the bump gold ball 27.

The predetermined position may be calculated or experimentally determined on the basis of conditions such as a position of the gold ball 25, a position of the inner lead 40, material for the loop-like wire 26 and the bump gold ball 27, operational conditions of the capillary to be used, and a tolerance value for stress occurring at the top 25a of the gold ball 25. For this reason, in the semiconductor IC chip 23, it is necessary that the electrode pad 24 has a wide size so as to include a corresponding position to the determined predetermined position. There is no functional difference between the cases that a single electrode pad is used as the second embodiment (which may make the structure simple) and that a plurality of electrode pads are formed as the first embodiment (which may make material for the electrode pads to be reduced).

As described above, according to the semiconductor device and the method of manufacturing the semiconductor device of the second embodiment, the bump gold ball 27 is bonded at a position where the height of the highest part of the loop-like wire 26 may be lowered in comparison with a case with no bump gold ball, thereby the semiconductor device may be reduced in thickness.

According to the semiconductor device and the method of manufacturing the semiconductor device of the second embodiment, the single electrode pad 24 includes the gold ball 25 and the bump gold ball 27, thereby it is suitable for a case that a distance between the gold ball 25 and the bump gold ball 27 is desired to be small, i.e., an area of the semiconductor IC chip is desired to be small.

In the second embodiment, the single electrode pad 24 for wire bonding which has a long length in a direction toward the inner lead 40 is provided on the upper surface of the semiconductor IC chip 23. This is the difference from the first embodiment.

Third Embodiment

Figure 10:
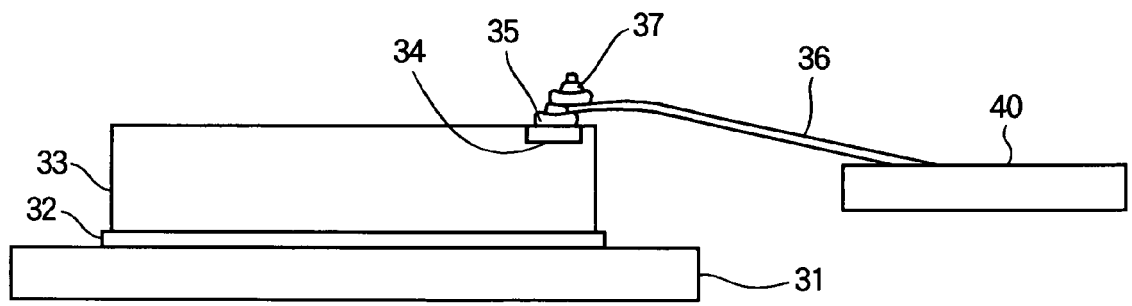
FIG. 10 is a longitudinal sectional view schematically illustrating a semiconductor device according to a third embodiment of the present invention.
Figure 11:
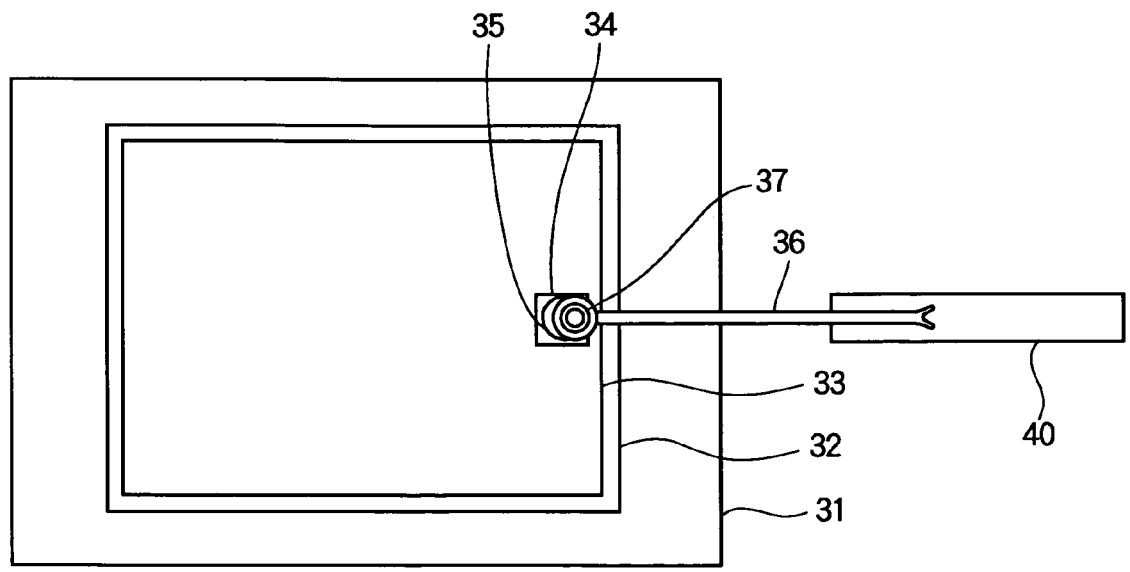
FIG. 11 is a plan view schematically illustrating the structure of FIG. 10.
Figure 12:
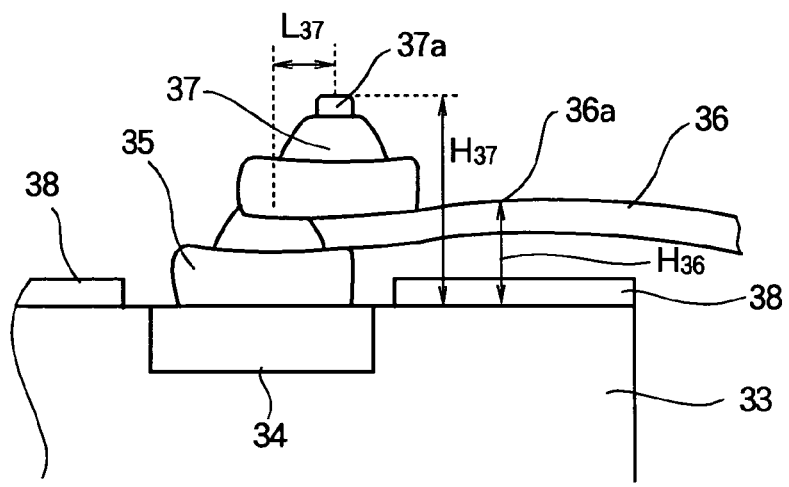
FIG. 12 is an enlarged view of a main part of the semiconductor device for explaining the semiconductor device and a method of manufacturing the semiconductor device according to the third embodiment of the present invention.
Figure 13:
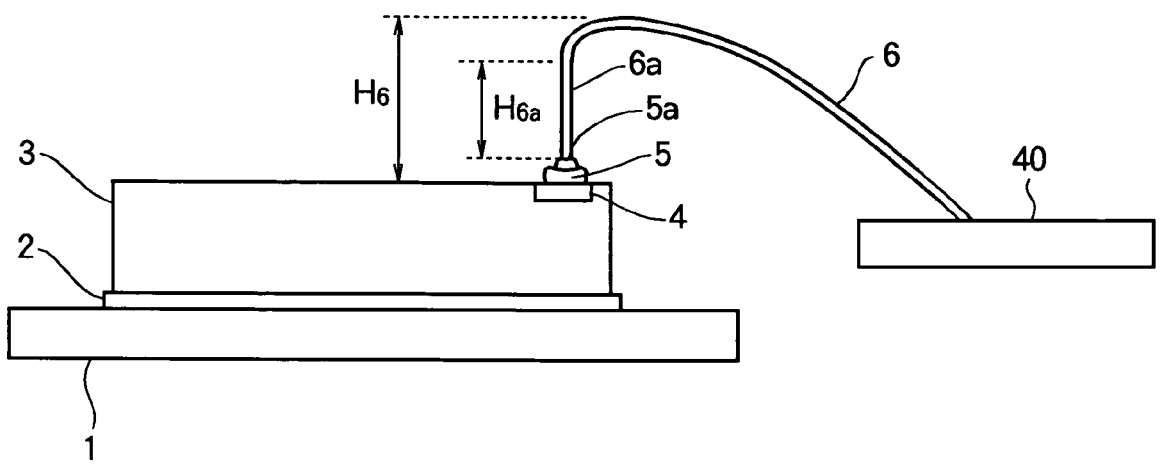
FIG. 13 is a longitudinal sectional view schematically illustrating a conventional semiconductor device.

FIG. 10 is a longitudinal sectional view schematically illustrating steps of a method of manufacturing a semiconductor device according to a third embodiment of the present invention, FIG. 11 is a plan view schematically illustrating the structure of FIG. 10, and FIG. 12 is an enlarged view of a main part for explaining the semiconductor device and the method of manufacturing the semiconductor device according to the third embodiment.

In the method of manufacturing the semiconductor device according to the third embodiment, a semiconductor IC chip 33 which is fixed on a die pad 31 with an adhesive agent 32 and the inner lead 40 are disposed in predetermined positions in a wire bonding apparatus (not illustrated in the drawing). At that time, in general, the inner lead 40 is disposed to be lower than an upper surface of the semiconductor IC chip 33. In the third embodiment, an electrode pad 34 for wire bonding is disposed on the upper surface of the semiconductor IC chip 33. An insulating film (not illustrated in the drawing) may be provided on the upper surface of the semiconductor IC chip 33, if necessary. The insulating film may be formed at least below a loop-like wire 36 which electrically connects a bump gold ball 37 and the inner lead 40.

Next, by a capillary of the wire bonding apparatus (not illustrated in the drawing), a gold ball 35 is formed on the electrode pad 34 of the semiconductor IC chip 33, an end of the wire is bonded to the electrode pad 34 by the gold ball 35, and the other end of the wire is bonded to the inner lead 40. As a result, the loop-like wire 36 is formed so as to extend from the gold ball 35 on the electrode pad 34 to the inner lead 40.

Next, a bump gold ball is formed at a tip of the capillary. Then, the loop-like wire 36 is bonded by using the bump gold ball 37 so that the loop-like wire 36 is pressed down toward the semiconductor IC chip 33, on the gold ball 35 which is disposed at a predetermined position on the semiconductor IC chip 33 on a side of the inner lead 40 from the gold ball 35 (a distance $L_{37}$ in FIG. 12) and on the side of the inner lead 40 from the gold ball 35. The step of bonding the loop-like wire 36 by using the bump gold ball 37 includes a step, in which the bump gold ball 37 presses down the loop-like wire 36 on a top of the gold ball 35. At this step, the bump gold ball 37 may press down the loop-like wire 36 on the top of the gold ball 35 for bonding, at a position which is slightly shifted from directly above the gold ball 35 in a horizontal direction. For example, the loop-like wire 36 may be bonded on the gold ball 35 by using the bump gold ball 37 which has a center on a side of the inner lead 40 from a center of the gold ball 35. Thus, bonding by using the bump gold ball 37 which presses down the loop-like wire 36 on the top of the gold ball 35 at a position which is slightly shifted from directly above the gold ball 35 in the horizontal direction makes it possible to solve a problem of a height of the chip caused when the loop-like wire 36 is pressed down at a position directly above the gold ball 35 by using the bump gold ball 37 (i.e., the height of the whole chip is greater because the wire is between the gold ball 35 and the bump gold ball 37), thereby the height of the whole chip may be reduced. By interposing the loop-like wire 36 between the gold ball 35 and the bump gold ball 37, a structure in which the bump gold ball 37 strengthens the top of the gold ball 35 is obtained, even if the loop-like wire 36 is reduced in height as in FIG. 12, thereby electrical reliability may be improved.

According to the semiconductor device and the method of manufacturing the semiconductor device of the third embodiment, in a similar manner to the first embodiment, the predetermined position (which may be specified by the distance $L_{37}$ between a center of the gold ball 35 and a center of the bump gold ball 37, for example) is set so that a height $H_{36}$ of a highest part of the loop-like wire 36 after bonding the loop-like wire 36 by using the bump gold ball 37 is lower than a height of the highest part of the loop-like wire 36 before bonding the loop-like wire 36 by using the bump gold ball 37, and the height $H_{36}$ of the highest part of the loop-like wire 36 is lower than a height $H_{37}$ of a top 37a of the bump gold ball 37. That is, the predetermined position is set so that the height $H_{36}$ of the highest part of the whole of the loop-like wire 36 is lower than the height $H_{37}$ of the top 37a of the bump gold ball 37.

The predetermined position may be calculated or experimentally determined on the basis of conditions such as a position of the gold ball 35, a position of the inner lead 40, material for the loop-like wire 36 and the bump gold ball 37, operational conditions of the capillary to be used, and a tolerance value of stress occurring at the top of the gold ball 35.

As described above, according to the semiconductor device and the method of manufacturing the semiconductor device of the third embodiment, the bump gold ball 37 is bonded at a position where the height of the highest part of the loop-like wire 36 may be lowered, thereby the semiconductor device may be reduced in thickness.

According to the semiconductor device and the method of manufacturing the semiconductor device of the third embodiment, the top 35a of the gold ball 35 is strengthened by using the bump gold ball 37 which presses down the top 35a of the gold ball 35, thereby risk of a rupture of the loop-like wire 36 at the top 35a of the gold ball 35 may be reduced and reliability of electrical performance may be improved.

The invention being thus described, it will be obvious that the same may be varied in many ways. Such variations are not to be regarded as a departure from the spirit and scope of the invention, and all such modifications as would be obvious to one skilled in the art are intended to be included within the scope of following claims.

What is claimed is:

1. A method of manufacturing a semiconductor device, comprising:
    preparing a semiconductor IC chip and an external electrode terminal which is positioned away from the semiconductor IC chip, wherein the semiconductor IC chip has first electrode pad which has first and second portions thereon, the second portion being positioned between the first portion of the first electrode pad and the external electrode terminal;
    connecting the first portion of the first electrode pad and the external electrode terminal by a loop-like wire; and
    thereafter pressing a portion of the loop-like wire toward the semiconductor IC chip, thereby connecting the portion of the loop-like wire with the second portion of the first electrode pad.

2. The method of manufacturing the semiconductor device according to claim 1, wherein the portion of the loop-like wire is pressed by a conductive bump at said pressing of the portion of the loop-like wire toward the semiconductor IC chip.

3. The method of manufacturing the semiconductor device according to claim 1, wherein the portion of the loop-like wire is pressed by a conductive bump at said pressing of the portion of the loop-like wire toward the semiconductor IC chip so that a height of a highest part of the loop-like wire in the whole of the loop-like wire becomes lower that a height of a top of the conductive bump.

4. The method of manufacturing the semiconductor device according to claim 1, further comprising: forming an insulating film on the semiconductor IC chip, wherein the insulating film is located between the second portion and the external electrode terminal, before said connecting of the first portion of the first electrode pad and the external electrode terminal by a loop-like wire.

5. A method of manufacturing a semiconductor device, comprising:
    bonding an end of a wire to an electrode pad of a semiconductor IC chip by using a gold ball, and bonding the other end of the wire to an external electrode terminal, thereby forming a loop-like wire extending from the electrode pad to the external electrode terminal; and
    bonding the loop-like wire by using a bump gold ball so that a part of the loop-like wire is pressed down toward the semiconductor IC chip;
    wherein at least a height of a highest part of the loop-like wire on a side of the external electrode terminal from the bump gold ball is lower than a height of a top of the bump gold ball, and
    wherein the bump gold ball is arranged on the semiconductor IC chip so that the external electrode is closer to a center of the bump gold ball than to a center of the gold ball.

6. The method of manufacturing the semiconductor device according to claim 5, wherein said bonding of the loop-like wire by using the bump gold ball includes bonding the loop-like wire to another electrode pad of the semiconductor IC chip by using the bump gold ball.

7. The method of manufacturing the semiconductor device according to claim 5, wherein
    the electrode pad has a bonding area between the external electrode terminal and the gold ball, and
    said bonding of the loop-like wire by using the bump gold ball includes bonding the loop-like wire to the bonding area of the electrode pad by using the bump gold ball.

8. The method of manufacturing the semiconductor device according to claim 5, wherein said bonding of the loop-like wire by using the bump gold ball includes bonding the loop-like wire on the gold ball by using the bump gold ball, and wherein the center of the bump gold ball is disposed between the external electrode terminal and the center of the gold ball.

9. The method of manufacturing the semiconductor device according to claim 5, further comprising forming an insulating film on the semiconductor IC chip on the side of the external electrode terminal from the gold ball, before said bonding of the end of the wire by the gold ball.

10. The method of manufacturing the semiconductor device according to claim 5, wherein
    a height of a highest part of the loop-like wire before bonding of the loop-like wire by using the bump gold ball is within a range from 80 μm to 150 μm, and
    a height of a highest part of the loop-like wire after bonding of the loop-like wire by using the bump gold ball is lower than the height of the highest part of the loop-like wire before bonding of the loop-like wire by using the bump gold ball.

11. A method of manufacturing a semiconductor device, comprising:
    preparing a semiconductor IC chip and an external electrode terminal which is placed away from the semiconductor IC chip, wherein the semiconductor IC chip has a first electrode pad;
    depositing a first conductive bump on the first electrode pad, and connecting the first conductive bump and an external electrode terminal by a loop-like wire; and
    depositing a second conductive bump, which extends over the first conductive bump and the loop-like wire,
    wherein the second conductive bump is deposited so that a distance from the second conductive bump to the external electrode is shorter than a distance from the first conductive bump to the external electrode.

12. The method of manufacturing the semiconductor device according to claim 11, wherein the second conductive bump is deposited so as to press down the loop-like wire toward the semiconductor IC chip.

13. A method of manufacturing a semiconductor device comprising:
- preparing an inner lead and a semiconductor IC chip disposed at a distance from the inner lead, the semiconductor IC chip having a first electrode on a surface of the semiconductor IC chip;
- depositing a gold ball on the first electrode so that the gold ball is electrically connected to the first electrode;
- positioning a loop-like wire extending from the gold ball to the inner lead for electrical connection to the inner lead; and
- thereafter causing a bump gold ball to press down a part of the loop-like wire toward the gold ball,
- wherein the bump gold ball is positioned so that a distance from the bump gold ball to the inner lead is shorter than a distance from the gold ball to the inner lead.

14. The method of manufacturing the semiconductor device according to claim 2, wherein said pressing of the portion of the loop-like wire by the conductive bump is performed by pressing the conductive line to the portion of the loop-like wire using a capillary.

* * * * *